(12) United States Patent
Caty et al.

(10) Patent No.: US 7,065,724 B2
(45) Date of Patent: Jun. 20, 2006

(54) METHOD AND APPARATUS FOR GENERATING AND VERIFYING LIBRARIES FOR ATPG TOOL

(75) Inventors: Olivier Caty, San Jose, CA (US); Ismet Bayraktaroglu, Sunnyvale, CA (US); Amitava Majumdar, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 487 days.

(21) Appl. No.: 10/349,570

(22) Filed: Jan. 22, 2003

(65) Prior Publication Data

US 2004/0143783 A1 Jul. 22, 2004

(51) Int. Cl.
*G06F 17/50* (2006.01)

(52) U.S. Cl. ............................................ 716/4; 716/5
(58) Field of Classification Search ................ 716/2–4, 716/16–18, 5
See application file for complete search history.

(56) References Cited

U.S. PATENT DOCUMENTS

| | | | |
|---|---|---|---|
| 6,195,776 B1 * | 2/2001 | Ruiz et al. .................. 714/738 |
| 6,301,688 B1 * | 10/2001 | Roy ............................... 716/4 |
| 6,463,560 B1 * | 10/2002 | Bhawmik et al. ........... 714/733 |
| 6,665,844 B1 * | 12/2003 | Stanion ......................... 716/5 |
| 6,925,617 B1 * | 8/2005 | Bayraktaroglu et al. ....... 716/4 |

* cited by examiner

Primary Examiner—Vuthe Siek
Assistant Examiner—Binh Tat
(74) Attorney, Agent, or Firm—Gunnison, McKay & Hodgson, L.L.P.

(57) ABSTRACT

A method generates and verifies a design-for-test (DFT) library for an automatic test pattern generator (ATPG) tool. The method includes (a) creating a synthesis library including primitives to be used to create the modules, the primitives being the same as primitives used by the ATPG tool, (b) creating a register transfer level (RTL) description for each module, (c) performing synthesis using the synthesis library and the RTL description to create a gate level description for each module, and (d) generating the DFT library by converting a hardware description language (HDL) of the gate level description into a script language for the ATPG tool to create a DFT file for each module. The method may further include (e) converting the DFT files into a RTL description to create a pseudo-RTL description for each module, and (f) comparing the RTL description and the pseudo-RTL description for verification of the DFT library.

34 Claims, 4 Drawing Sheets

METHOD AND APPARATUS FOR GENERATING AND VERIFYING LIBRARIES FOR ATPG TOOL

FIELD OF THE INVENTION

The present invention relates to testing electronic systems. More particularly, the present invention relates to a method and an apparatus for generating and verifying libraries used to test an integrated circuit (IC) design.

BACKGROUND OF THE INVENTION

In order to ensure proper operation and high-quality of ICs, manufacturing tests must be run on each fabricated device so as to detect structural faults and eliminate defective parts or devices. An IC design typically includes design-for-test (DFT) so as to make the IC design testable or scannable. An automatic test pattern generation (ATPG) tool, such as FastScan™, available from Mentor Graphics® Corporation of Wilsonville, Oreg., produces manufacturing test vectors (scan test patterns) for IC designs. As IC designs grow larger and access to logic becomes more limited, the task of ATPG tools becomes more challenging.

An ATPG tool relies on dedicated ATPG libraries, which is also referred to as design-for-test (DFT) libraries, to generate the test patterns. Such dedicated libraries include ATPG models for modules of the IC design, and are typically generated manually from a source design library which is written in the register-transfer-level language (RTL). However, such manual generation is extremely time-consuming and error prone task, as it includes, for example, RTL modification, removal of certain constructs, gathering information, and writing models. Furthermore, the generated ATPG models are not verified until silicon process is completed. However, ATPG models might be incomplete, for example, missing "stuck_at" detection or having insufficient fault coverage. A substantially long time period (for example, several days) is required for a DFT team to run ATPG on a new circuit design after obtaining a RTL code for the design, including modification of the RTL code, removing some constructs not supported by the ATPG, and writing ATPG models.

BRIEF DESCRIPTION OF THE INVENTION

A method generates and verifies a design-for-test (DFT) library for an automatic test pattern generator (ATPG) tool. The method includes (a) creating a synthesis library including primitives to be used to create the modules, the primitives being the same as primitives used by the ATPG tool, (b) creating a register transfer level (RTL) description for each module, (c) performing synthesis using the synthesis library and the RTL description to create a gate level description for each module, and (d) generating the DFT library by converting a hardware description language (HDL) of the gate level description into a script language for the ATPG tool to create a DFT file for each module. The method may further include (e) converting the DFT files into a RTL description to create a pseudo-RTL description for each module, and (f) comparing the RTL description and the pseudo-RTL description for verification of the DFT library.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
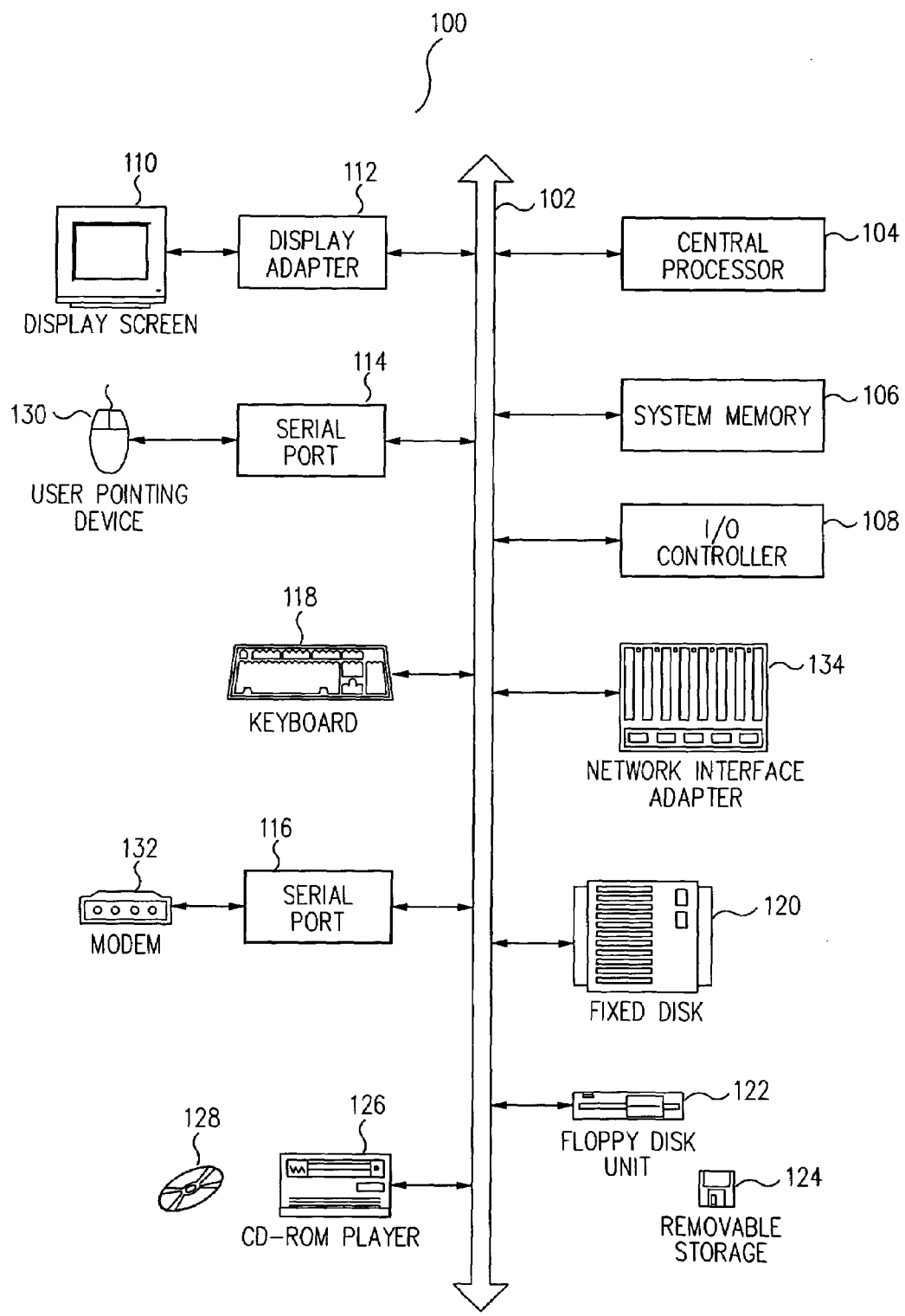
FIG. 1 is a block diagram schematically illustrating a computer system suitable for implementing aspects of the present invention.

Embodiments of the present invention are described herein in the context of a method and apparatus for generating and verifying libraries for an ATPG tool. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be run as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In accordance with one embodiment of the present invention, the method may be implemented on a data processing computer such as a personal computer, workstation computer, mainframe computer, or high performance server running an OS such as Solaris® available from Sun Microsystems, Inc. of Palo Alto, Calif., Microsoft® Windows® XP and Windows® 2000, available form Microsoft Corporation of Redmond, Wash., or various versions of the Unix operating system such as Linux available from a number of vendors. The method may also be implemented on a multiple-processor system, or in a computing environment including various peripherals such as input devices, output devices, displays, pointing devices, memories, storage devices, media interfaces for transferring data to and from the processor(s), and the like. In addition, such a computer system or computing environment may be networked locally, or over the Internet.

FIG. 1 depicts a block diagram of a computer system 100 suitable for implementing aspects of the present invention. As shown in FIG. 1, computer system 100 includes a bus 102 which interconnects major subsystems such as a central processor 104, a system memory 106 (typically RAM), an input/output (I/O) controller 108, an external device such as a display screen 110 via display adapter 112, serial ports 114 and 116, a keyboard 118, a fixed disk drive 120, a floppy disk drive 122 operative to receive a floppy disk 124, and a CD-ROM player 126 operative to receive a CD-ROM 128. Many other devices can be connected, such as a pointing device 130 (e.g., a mouse) connected via serial port 114 and a modem 132 connected via serial port 116. Modem 132 may provide a direct connection to a remote server via a telephone link or to the Internet via a POP (point of presence). Alternatively, a network interface adapter 134 may be used to interface to a local or wide area network using any network interface system known to those skilled in the art (e.g., Ethernet, xDSL, AppleTalk™).

Many other devices or subsystems (not shown) may be connected in a similar manner. Also, it is not necessary for all of the devices shown in FIG. 1 to be present to practice the present invention, as discussed below. Furthermore, the devices and subsystems may be interconnected in different ways from that shown in FIG. 1. The operation of a computer system such as that shown in FIG. 1 is readily known in the art and is not discussed in detail in this application, so as not to complicate the present discussion. Code to implement the present invention may be operably disposed in system memory 106 or stored on storage media such as fixed disk 120, floppy disk 124 or CD-ROM 128.

Figure 2:
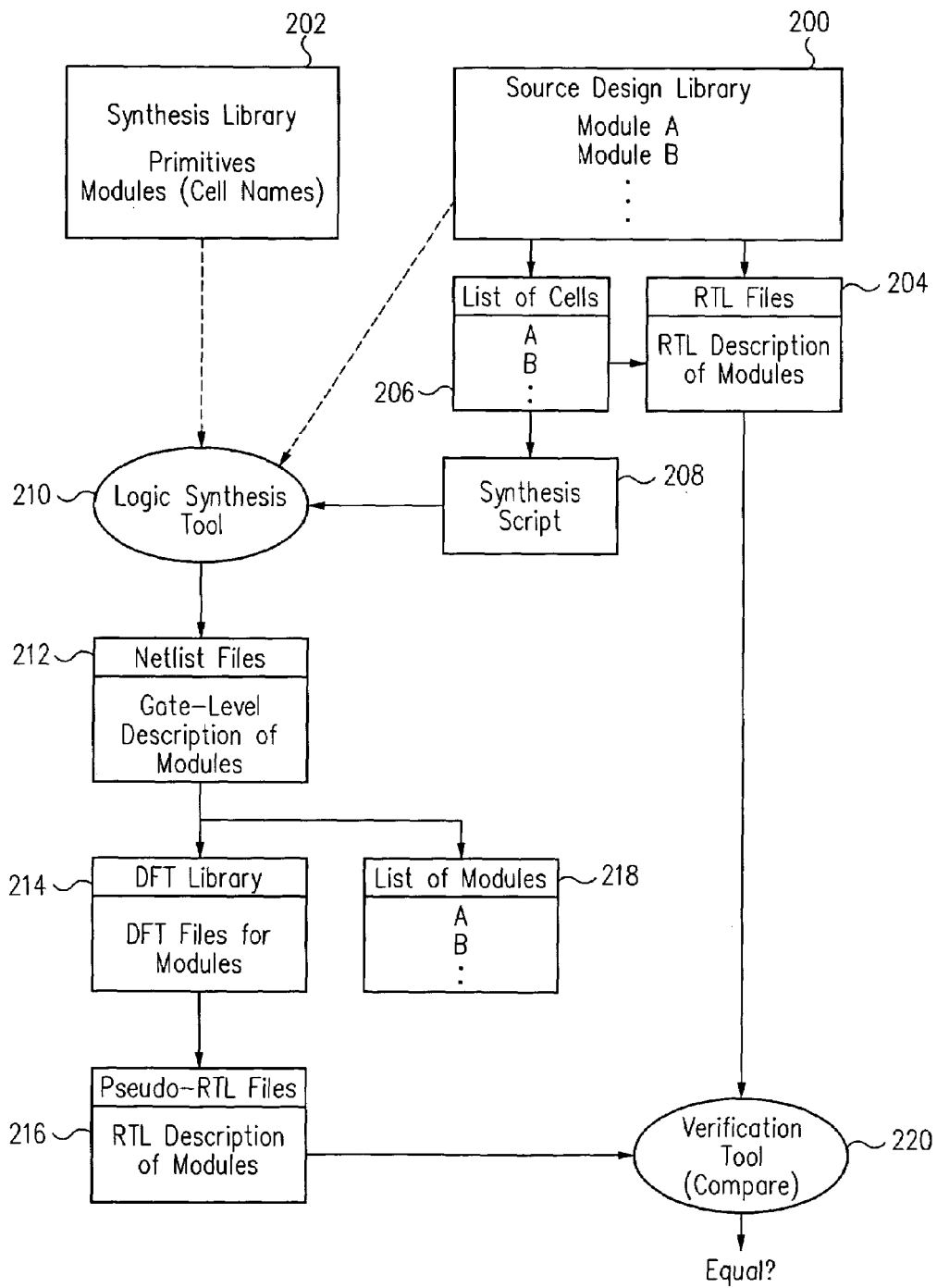
FIG. 2 is a block diagram schematically illustrating a method for generating a DFT library for an ATPG tool in accordance with one embodiment of present invention.

FIG. 2 schematically illustrates a method for generating a DFT library for an ATPG tool in accordance with one embodiment of present invention. The ATPG tool generates test vectors (binary stimulus) for an IC design under the test. The IC design typically includes a plurality of cells. For example, such an IC design include "system-on a-chip" design. A source design library 200 for the IC design contains information of the IC design, including design modules corresponding to the cells. For example, the source design library 200 may include module A, module B, module C, . . . which correspond to cell A, cell B, cell C, . . . , respectively, in a physical layout of the IC design. The source design library 200 is typically written in a hardware description language such as Verilog, or VHDL.

A synthesis library 202 is created so that it includes the same primitives as that used by the ATPG tool. Primitives represent basic logic functions, such as AND, OR, NAND, NOR, FF (Flip-flop), etc., and various combinations of the primitives are used to create the modules. In accordance with one embodiment of present invention, the synthesis library 202 includes all primitives used by the ATPG tool. In accordance with one embodiment of present invention, the synthesis library 202 includes all and only primitives used by the ATPG tool. The synthesis library 202 may further include module identifications used by the ATPG tool. For example, the module identifications may be the corresponding cell names used in the DFT library for the ATPG tool.

As shown in FIG. 2, a register transfer level (RTL) description 204 is created for each module using the source design library 200. For example, a RTL file is created for each module (i.e., cells) so that each RTL file includes the RTL description of the corresponding module (single module RTL file). A logic synthesis tool 210 is used to synthesize the IC design. For example, Design Compiler™, a logic synthesis tool available from Synopsys, Inc. of Mountain View, Calif., may be used as the synthesis tool 210. However, any other synthesis tools or netlist generators may be used to generate gate models of the cells from the RTL code. Typically, an association 206 between the cell names and the RTL files, for example, a list of RTL modules (by the cell names), and a synthesis script (list of instructions) 208 are created for the synthesis tool 210. Such a list of modules/cells 206 and the synthesis script 208 may be generated using a Perl script.

The synthesis tool 210 performs logic synthesis using the synthesis library 202 and the RTL description 204 of each module in accordance with the synthesis script 208. The synthesis script 208 can use the cell list 206 to read the RTL files 204. The synthesis tool 210 creates a gate level description 212 for each module, typically written in a hardware description language (HDL) such as Verilog or VDHL. For example, the gate level description 212 is a netlist file for the gate models of each cell.

Then, the DFT library 214 is generated by converting the HDL description of the gate model into a script language for the ATPG tool so as to create a DFT file for each module. That is, the DFT library 214 includes a set of DFT files corresponding to the modules. The script language is typically ATPG tool-specific, but any software can be used to transform the netlist (gate model) 212 to the DFT library format (with DFT primitives). In accordance with one embodiment of present invention, the synthesis library 202 contains only the same primitives and the same cell names as that of the DFT library, optimizing the conversion. An association between the cell names and the DFT files, for example, a list 218 of the DFT modules (by the cell names) may be created for the DFT library 214.

In accordance with one embodiment of present invention, the DFT library 214 is verified using a verification tool 220. As shown in FIG. 2, each of the DFT files in the DFT library is converted back into a RTL description 216 to create pseudo-RTL files (pseudo gate models). Since the RTL description 216 is created from the DFT library 214 rather than from the source design library 200, it is referred to as "pseudo-RTL" description. Each pseudo-RTL file corresponds to a module.

Then, the pseudo-RTL description 216 is compared with the original RTL description 204 for each module by the verification tool 220. For example, a functional equivalence checker such as ESP-CV™, available from Innologic systems, Inc., of San Jose, Calif., may be used as the verification tool 220. The verification tool 220 conducts formal verification of the two descriptions 204 and 216, and outputs the result, for example, as a set of binary vectors depicting difference. The result can be use in the necessary debug process of the DFT library.

Figure 3:
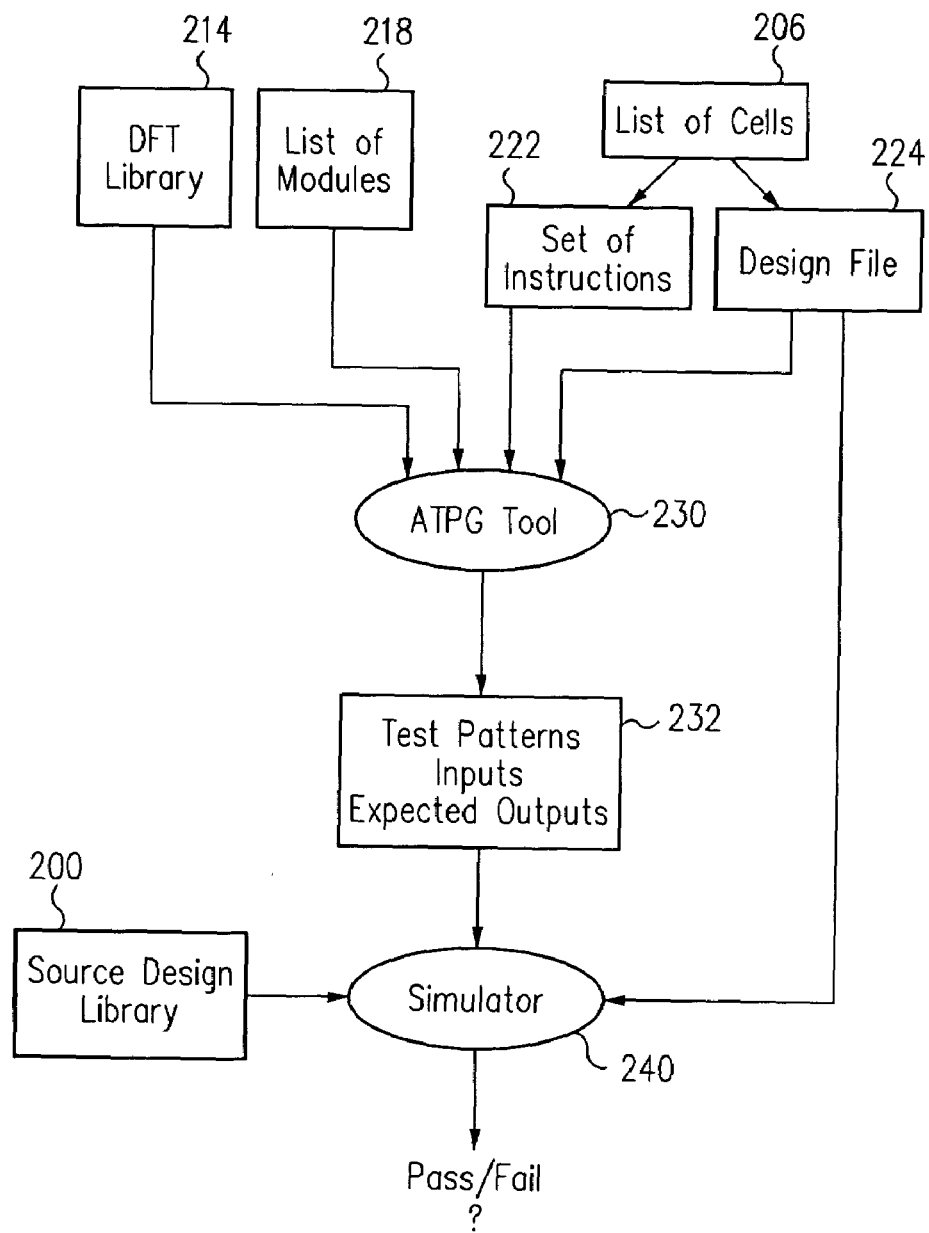
FIG. 3 is a diagram schematically illustrating a method for verifying a DFT library for an ATPG tool in accordance with one embodiment of present invention.
Figure 4A:
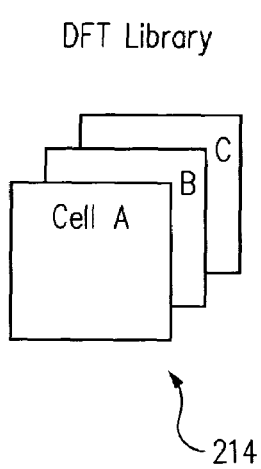
FIGS. 4A and 4B are diagram schematically and conceptually illustrating the DFT library and the test design in the test design file, respectively, in accordance with one embodiment of present invention.
Figure 4B:
Figure 4B:
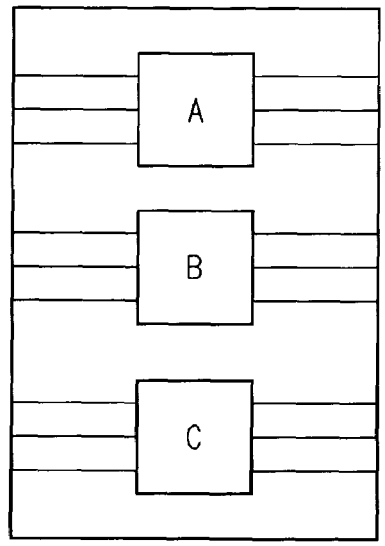

In accordance with one embodiment of present invention, the DFT library 214 is also verified by creating a pseudo design containing all of the cells in the DFT library. FIG. 3 schematically illustrates this verification method using the ATPG tool. Using the cell list 206 created from the source design library 200, a set of program instructions 222 for the ATPG tool 230 and a test design file 224 are created. The design file 224 contains a pseudo design that includes all cells of the IC design. However, the cells in the pseudo design are described as "black boxes," and the design file 224 only has the cells' inputs, outputs, and interconnectivity, but does not have the inside-information of the cells. The design file 224 also includes inputs and outputs of the IC design. FIGS. 4A and 4B schematically and conceptually illustrates the DFT library 214 and the test design in the test design file 224, respectively. It should be noted that the pseudo design does not reflect physical layout of cells of the IC design.

The ATPG tool 230 generates test patterns 232 using the DFT library 214 (with the module list 218) and the test design file 224 in accordance with the instructions 222. For example, FastScan™, available from Mentor Graphics® Corporation of Wilsonville, Oreg., may be used as the ATPG tool 230. The test patterns 232 includes inputs stimuli and expected responses (outputs) of the IC design that is represented by the pseudo design (design file 224). Then, the IC design (test design file 224) is simulated by a simulator 240. The simulator 240 performs simulation on the design file 224 using the test patterns 232 and the source design file 200, and outputs the result of the simulation. Typically, the input stimuli are applied to the design, and the actual responses output from the simulated design are captures and compared with the expected responses. The DFT library 214 is verified from the pass/fail result of the comparison. If the output and the expected responses do not match, the DFT library and the tools/scripts are subjected to a debug process.

As described above, in accordance with the embodiments of present invention, the DFT library is generated from RTL code and verified. The synthesis library is created so that it contains the primitives used by the targeted ATPG tool. The synthesis library, for optimization, contains the all and only primitives used by the ATPG tool and use exactly the same cell names as the DFT library. This simplifies and optimizes the conversion of the generated gate models (netlists) of the modules into a DFT library format.

As described above, the verification of the DFT library includes two types. First, the DFT library (a set of DFT module files) is converted back into a pseudo gate model in RTL description. This generates a pseudo RTL files for each module (pseudo RTL files), and the pseudo RTL files are compared with the original RTL files for formal verification (equivalency check). That is, the DFT library is first verified by the formal verification of each module.

In the second verification process, the test design containing all of the cells in the DFT library is generated. However, the test design does not include intra-cell information. The DFT library, which has the intra-call (module) information, is read with the test design file into the target ATPG tool to generate the test patterns (ATPG vectors). The DFT library is verified by re-simulating the test patterns using the original RTL code, i.e., the source design library.

In accordance with the embodiments of present invention, if the original RTL code is synthesizable, the DFT library can be generated in a short time period, for example, less than one hour. Quality of the DFT library is also assured by the early-stage verification processes. In addition, by using the same module/cell names in the synthesis library, multiple definition of a module is avoided.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for generating a design-for-test (DFT) library for an automatic test pattern generator (ATPG) tool, the ATPG tool generating test vectors for an integrated circuit (IC) design including cells, and a source design library of the IC design including modules corresponding to the cells, said method comprising:
   creating a synthesis library including primitives to be used to create the modules, the primitives being the same as primitives used by the ATPG tool;
   creating a register transfer level (RTL) description for each module;
   performing synthesis using the synthesis library and the RTL description of each module, so as to create a gate level description for each module;
   generating the DFT library by converting a hardware description language (HDL) of the gate level description into a script language for the ATPG tool so as to create a DFT file for each module; and
   verifying the DFT library, said verifying comprising:
      converting the DFT files into a RTL description so as to create a pseudo-RTL description for each module; and
      comparing the RTL description and the pseudo-RTL description.

2. A method in accordance with claim 1, wherein the synthesis library includes all primitives used by the ATPG tool.

3. A method in accordance with claim 2, wherein the synthesis library includes all and only primitives used by the ATPG tool.

4. A method in accordance with claim 1, wherein the synthesis library further includes module identifications used by the ATPG tool.

5. A method in accordance with claim 4, wherein the module identifications are the corresponding cell names used in the DFT library.

6. A method in accordance with claim 1, wherein said creating a register transfer level (RTL) description includes:
   creating a first file for each module, the first file including the RTL description of the module.

7. A method in accordance with claim 6, further comprising:
   creating an association between cell names and the first files; and
   creating a synthesis script for a synthesis tool.

8. A method in accordance with claim 7, wherein the association is in a form of a list of RTL modules.

9. A method in accordance with claim 1, wherein said performing synthesis includes:
   creating a second file for each module, the second file including the gate level net list of the module.

10. A method in accordance with claim 1 wherein said converting includes:
    creating a third file for each module, the third file including the pseudo-RTL description of the module.

11. A method in accordance with claim 1, further comprising:
    creating an association between cell names and the DFT files.

12. A method in accordance with claim 11 wherein the association is in a form of a list of DFT modules.

13. A method in accordance with claim 1, further comprising:
    creating a set of program instructions for the ATPG tool and a test design file using a list of cells;

generating test patterns with the ATPG tool using the DFT library and the test design file; and simulating the IC design with the test patterns using the test design file and the source design file so as to verify the DFT library.

14. A method in accordance with claim 13, wherein the design file includes inputs and outputs of the IC design and inter-cell connectivity.

15. An apparatus for generating a design-for-test (DFT) library for automatic test pattern generation (ATPG), the ATPG generating test vectors for an integrated circuit (IC) design including cells, a source design library of the IC design including modules corresponding to the cells, said apparatus comprising:

means for creating a synthesis library including primitives to be used to create the modules, the primitives being the same as primitives used by the ATPG tool;

means for creating a register transfer level (RTL) description for each module;

means for performing synthesis using the synthesis library and the RTL description of each module, so as to create a gate level description for each module;

means for generating the DFT library, said means for generating the DFT library including means for converting a hardware description language (HDL) of the gate level description into a script language for the ATPG tool so as to create a DFT file for each module; and means for verifying the DFT library, said means for verifying comprising:

means for converting the DFT files into a RTL description so as to create a pseudo-RTL description for each module; and means for comparing the RTL description and the pseudo-RTL description.

16. An apparatus in accordance with claim 15, wherein the synthesis library includes all primitives used by the ATPG tool.

17. An apparatus in accordance with claim 16, wherein the synthesis library includes all and only primitives used by the ATPG tool.

18. An apparatus in accordance with claim 15, wherein the synthesis library further includes module identifications used by the ATPG tool.

19. An apparatus in accordance with claim 18, wherein the module identifications are the corresponding cell names used in the DFT library.

20. An apparatus in accordance with claim 15, wherein said means for creating a RTL description includes:

means for creating a first file for each module, the first file including the RTL description of the module.

21. An apparatus in accordance with claim 20, further comprising:

means for creating an association between cell names and the first files; and means for creating a synthesis script for a synthesis tool.

22. An apparatus in accordance with claim 21, wherein the association is in a form of a list of RTL modules.

23. An apparatus in accordance with claim 15, wherein said means for performing synthesis includes:

means for creating a second file for each module, the second file including the gate level net list of the module.

24. An apparatus in accordance with claim 15 wherein said means for converting includes:

means for creating a third file for each module, the third file including the pseudo-RTL description of the module.

25. An apparatus in accordance with claim 15, further comprising:

means for creating an association between cell names and the DFT files.

26. An apparatus in accordance with claim 25, wherein the association is in a form of a list of DFT modules.

27. An apparatus in accordance with claim 15, further comprising:

means for creating a set of program instructions for the ATPG tool and a test design file using a list of cells;

means for generating test patterns with the ATPG tool using the DFT library and the test design file; and means for simulating the IC design with the test patterns using the test design file and the source design file so as to verify the DFT library.

28. An apparatus in accordance with claim 27, wherein the design file includes inputs and outputs of the IC design and inter-cell connectivity.

29. A program storage device readable by a machine, tangibly embodying a program of instructions executable by the machine to perform a method for generating a design-for-test (DFT) library for an automatic test pattern generator (ATPG) tool, the ATPG tool generating test vectors for an integrated circuit (IC) design including cells, and a source design library of the IC design including modules corresponding to the cells, said method comprising:

creating a synthesis library including primitives to be used to create the modules, the primitives being the same as primitives used by the ATPG tool;

creating a register transfer level (RTL) description for each module;

performing synthesis using the synthesis library and the RTL description of each module, so as to create a gate level description for each module;

generating the DFT library by converting a hardware description language (HDL) of the gate level description into a script language for the ATPG tool so as to create a DFT file for each module; and verifying the DFT library, said verifying comprising:

converting the DFT files into a RTL description so as to create a pseudo-RTL description for each module; and comparing the RTL description and the pseudo-RTL description.

30. A programmable storage device in accordance with claim 29, wherein the synthesis library includes all primitives used by the ATPG tool.

31. A programmable storage device in accordance with claim 30, wherein the synthesis library includes all and only primitives used by the ATPG tool.

32. A programmable storage device in accordance with claim 29, wherein the synthesis library further includes module identifications used by the ATPG tool.

33. A programmable storage device in accordance with claim 32, wherein the modules in the synthesis library have same names as corresponding cell names in the DFT library.

34. A programmable storage device in accordance with claim 29 wherein said method further includes:
creating a set of program instructions for the ATPG tool and a test design file using a list of cells;
generating test patterns with the ATPG tool using the DFT library and the test design file; and
simulating the IC design with the test patterns using the test design file and the source design file so as to verify the DFT library.

* * * * *